United States Patent [19]

Groves et al.

[11] 4,001,056
[45] Jan. 4, 1977

[54] EPITAXIAL DEPOSITION OF III-V COMPOUNDS CONTAINING ISOELECTRONIC IMPURITIES

[75] Inventors: Warren O. Groves; Arnold S. Epstein, both of St. Louis, Mo.

[73] Assignee: Monsanto Company, St. Louis, Mo.

[22] Filed: Nov. 11, 1974

[21] Appl. No.: 522,380

Related U.S. Application Data

[60] Continuation of Ser. No. 313,227, Dec. 8, 1972, abandoned, which is a division of Ser. No. 158,181, June 30, 1971, abandoned.

[52] U.S. Cl. .................. 148/175; 148/187; 156/612; 156/613; 313/498; 357/17; 357/63; 357/89; 357/90
[51] Int. Cl.[2] .................. H01L 21/20; H01L 29/12
[58] Field of Search ............ 148/171, 175, 187; 252/62.3 GA; 357/17, 63, 89, 90; 313/108 D; 156/612, 613

[56] References Cited
UNITED STATES PATENTS

| | | | |
|---|---|---|---|
| 3,603,833 | 9/1971 | Logan et al. | 313/108 D |
| 3,611,069 | 10/1971 | Galginaitis et al. | 148/175 X |
| 3,634,872 | 1/1972 | Umeda | 357/17 |
| 3,646,406 | 2/1972 | Logan et al. | 357/17 |
| 3,687,744 | 8/1972 | Ogirima et al. | 148/175 |
| 3,716,405 | 2/1973 | Lim | 148/175 UX |

OTHER PUBLICATIONS

Logan et al., "Efficient Green Electroluminescent Junctions in GaP," Solid–State Electronics, vol. 14, 1971, pp. 55–70.
Grenning et al., "Dislocations—GaAsP p-m Junctions," J. Applied Physics, vol. 39, No. 6, May 1968, pp. 2783–2790.
Herzog et al., "Electroluminescence of—GaAsP—Low Donor Concentrations," IBID., vol. 40, No. 4, Mar. 15, 1969, pp. 1830–1838.
Saul, R. H., "Effect of $GaAs_xP_{1-x}$ Transition Zone—GaAs Substrates," IBID., vol. 40, No. 8, July 1969, pp. 3273–3279.
Thomas et al., "Isoelectronic Traps Due to Nitrogen in Gallium Phosphide," Physical Rev., vol. 150, No. 2, Oct. 14, 1966, pp. 680–689.
Dean et al., "Green Electroluminescence—Room Temperature," J. Applied Phys., vol. 38, No. 13, Dec. 1967, pp. 5332–5342.

Primary Examiner—L. Dewayne Rutledge
Assistant Examiner—W. G. Saba
Attorney, Agent, or Firm—Peter S. Gilster

[57] ABSTRACT

The disclosure herein pertains to a vapor phase process for the preparation of electroluminescent materials, particularly GaP, doped with isoelectronic impurities, particularly nitrogen, and to electroluminescent devices fabricated therefrom.

5 Claims, 4 Drawing Figures

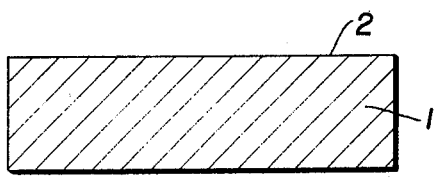
FIG.IA.
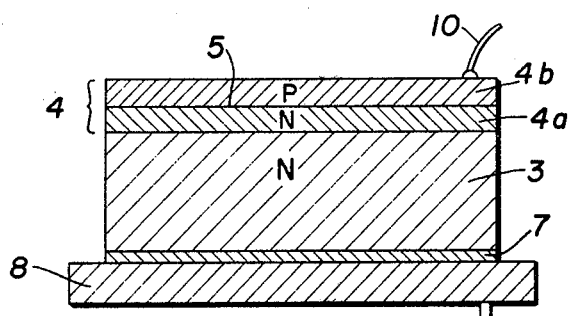
FIG.2.
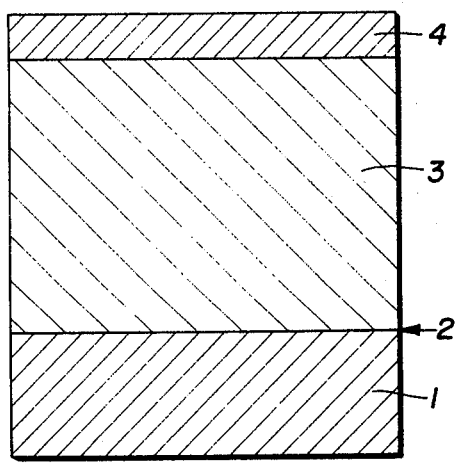
FIG.IB.
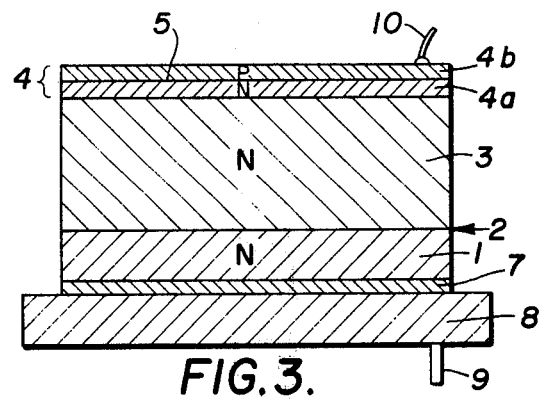
FIG.3.
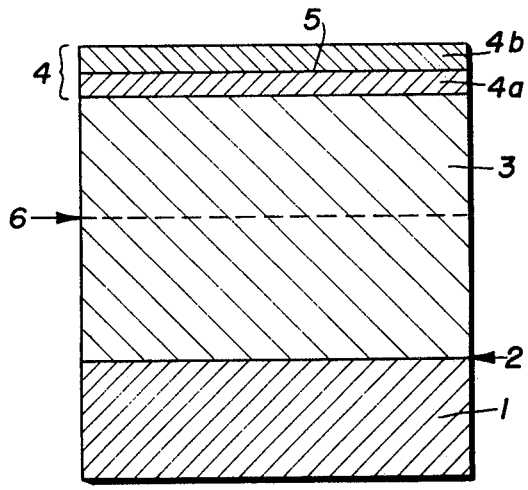
FIG.IC.
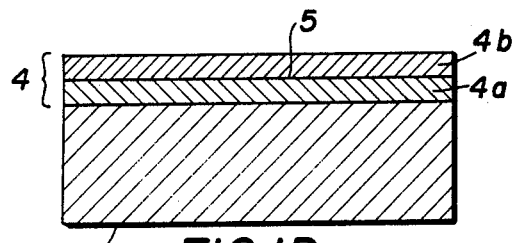
FIG.ID.
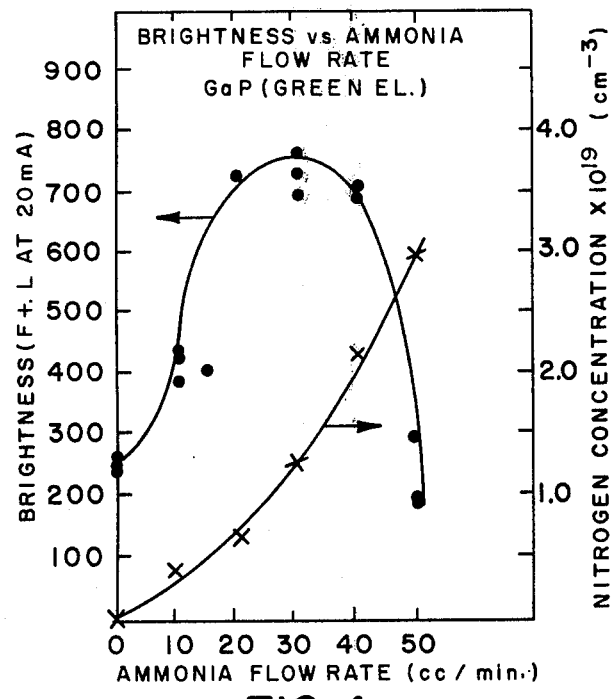
FIG.4.

EPITAXIAL DEPOSITION OF III-V COMPOUNDS CONTAINING ISOELECTRONIC IMPURITIES

This is a continuation of application Ser. No. 313,227, filed Dec. 8, 1972, now abandoned, which is a division of Ser. No. 158,181, filed June 30, 1971, now abandoned.

BACKGROUND OF THE INVENTION

This invention pertains to the field of electroluminescent materials and devices and the preparation thereof.

As pertinent to this invention, it is known in the prior art that nitrogen may be introduced into gallium phosphide (GaP) to create isoelectronic traps which function as radiative recombination centers for enhancement of the emission of green light when fabricated into junction devices. The prior art processes specifically designed for introducing nitrogen into the GaP, whether used as substrate or as an epitaxial film or both in the fabricated device, has been limited, apparently, to solution growth or liquid phase epitaxial processes. Typical of these prior art processes is that described, for example, in U.S. Pat. No. 3,462,320, where electroluminescent GaP devices are prepared by adding gallium nitride (GaN) and polycrystalline GaP containing a dopant of one conductivity type to a melt of elemental gallium (Ga) and heated to 1200° C in a sealed quartz ampoule, followed by cooling to 800° C over a period of about 10 hours. The irregularly-shaped signal crystals of nitrogen-doped GaP formed in the process is extracted from the gallium by washing in concentrated HCl, cut to size and shape and polished. The product thus formed is used as a substrate onto which an epitaxial layer of GaP of different conductivity type is grown by the liquid phase technique known as tipping. Contacts are affixed to the P and N regions to fabricate a two-terminal P-N junction device.

In other prior art processes a nitrogen-doped GaP epitaxial film is grown by liquid phase epitaxial deposition, e.g., by tipping, onto a substrate of GaP of opposite conductivity type to that in the epitaxial film; the GaP substrate may or may not be further doped with nitrogen.

Although much work has been done with various liquid phase epitaxial growth systems, typified by tilting reactor/furnace systems (tipping), crystal dipping, sliding tube and traveling solvent processes, numerous shortcomings and limitations are still encountered in use of these systems. Included among the disadvantages of liquid phase epitaxial growth systems are lack of positive initiation and termination of film growth, non-uniformity of film thickness across a single substrate surface and form substrate to substrate, necessity to remove deleterious surface oxides from the melt prior to epitaxial deposition, inadequate thermal coupling between the liquid charge and heat source, lack of reproducibility control in saturating melts of the liquid charge and/or the use of complex, expensive equipment.

It is also known to prepare electroluminescent GaP diodes by vapor phase processes. However, there seems to be no disclosure in the prior art specifically teaching the intentional doping of GaP with nitrogen in vapor phase processes to produce electroluminescent materials suitable for light-emitting diodes. In one known process, sulfur-doped GaP was epitaxially deposited from the vapor phase onto a gallium arsenide (GaAs) substrate by a phosphorus trichloride ($PCl_3$) transport process. In that process, purified hydrogen carrying the $PCl_3$ was combined with a stream of hydrogen carrying the sulfur impurity and the gaseous mixture introduced into a quartz reactor tube to react with Ga at 930° C and form GaP which was epitaxially deposited onto the GaAs substrate. Thereafter, a P-type dopant, e.g., zinc or beryllium, was diffused into the N-type GaP layer to form a P-N junction. The emission spectra for diodes fabricated from the epitaxial GaP/GaAs structure showed, inter alia, that isolated atoms of nitrogen were present as an unintentionally added impurity; no comment is offered as to either the possible source of nitrogen addition or its location within the device material, i.e., whether in the P or N regions of the GaP. The process referred to is described in more detail by E. G. Dierschke et al in the Journal of Applied Physics, Vol 41, No. 1, pages 321–328, January, 1970.

In a process described by P. J. Dean et al in Applied Physics Letters, Vol. 14, No. 7, pages 210–212, Apr. 1, 1969, phosphorus-rich $GaAs_xP_{1-x}$ doped with nitrogen was grown from the vapor by introducing phosphine ($PH_3$) and arsine ($AsH_3$) in a stream of wet hydrogen into an open tube reactor heated to about 1040° C wherein the water reacted with sintered boron nitride (BN) to generate $NH_3$ above the crystal growth zone; nitrogen from the $NH_3$ was used to dope the $GaAs_xP_{1-x}$, apparently uniformly throughout the growing crystal. However, the article published by Dean et al, supra, was directed primarily to a discussion of the localization energy of excitons at isoelectronic nitrogen sites in phosphorus-rich $GaAs_xP_{1-x}$, based on experimental results from optical absorption spectra. No disclosure is made in the Dean et al article pertaining to the fabrication of any semiconductor devices, including electroluminescent gallium arsenide phosphide or GaP P-N junction devices or performance characteristics thereof.

In the prior art processes referred to above, the isoelectronic impurity, nitrogen, is usually distributed uniformly throughout the epitaxial film and/or substrate upon which the film is deposited. Since the electroluminescence from isoelectronic nitrogen sites occurs within the vicinity of the P-N junction space charge region, nitrogen atoms in the remaining portions of the material absorb part of the emitted radiation. In order to obtain the desired nitrogen profile, it has been suggested that a liquid phase epitaxial double tipping technique be employed. In such proposed method, during the first tipping operation to grow a layer of one conductivity type, the epitaxial growth cooling cycle is interrupted after growth of a layer having a given nitrogen concentration, and the nitrogen content increased by adjusting the $NH_3$ concentration to increase the GaN concentration in the Ga growth solution. On resuming the cooling cycle the subsequent layer growth would have the desired higher nitrogen concentration. Next, a layer of opposite conductivity type is grown by a second tipping operation from a melt containing the desired GaN level. After a desired growth period, the cooling cycle is interrupted and GaN evaporated from the Ga growth melt. Upon resuming the cooling cycle, the remaining layer is grown with a low nitrogen level. In the proposed method, the product would have nitrogen distributed throughout both the substrate and all regions of the epitaxial layer.

Therefore, it is an object of this invention to provide a vapor phase process for the preparation of nitrogen-doped GaP electroluminescent materials.

It is a further object of this invention to provide a simple means for introducing nitrogen into a specified region of the epitaxial layer of GaP.

A further object of the invention is to provide a new composition of matter particularly suitable for use in the fabrication of electroluminescent devices.

Another object of this invention is to provide improved electroluminescent devices fabricated from the nitrogen-doped GaP produced herein.

These and other objects will become apparent from the detailed description of the invention given below.

SUMMARY OF THE INVENTION

This invention pertains to a vapor phase process for the introduction of isoelectronic impurities into the junction region only of semiconductor materials and to semiconductor devices prepared therefrom. In preferred embodiments, the invention pertains to the introduction of nitrogen into a specified region of GaP material which is subsequently fabricated into electroluminescent devices.

The GaP herein is prepared, in preferred embodiments, by reacting a hydrogen halide-in-hydrogen mixture with Ga and combining the reaction mixture with hydrogen carrying $PH_3$ and an impurity dopant of one conductivity type to form GaP which is deposited from the vapor phase onto a suitable substrate as an epitaxial film. When the desired film thickness has been reached, nitrogen is introduced into the reactant vapor stream and incorporated into the growing epitaxial layer only in the narrow surface region where the P-N junction is to be formed and radiation generated. Thereafter, the P-N junction is formed by either introducing into the reactant vapors an impurity of conductivity type opposite to that previously used or by diffusing an opposite-type impurity into the epitaxial layer after growth has been terminated.

The nitrogen-doped GaP epitaxial structure is then fabricated into electroluminescent devices by conventional techniques. By confining the nitrogen impurity to the surface region in which the P-N junction is formed, the remainder of the diode body, being free of nitrogen, is more transparent to the generated radiation, resulting in increased brightness at the shorter wavelengths and less shift of the color of the emission from green towards yellow, hence brighter green emission.

BRIEF DESCRIPTION THE DRAWINGS

In FIGS. 1A–1D are shown sequential steps in the preparation of semiconductor materials according to this invention.

In FIGS. 2 and 3 are shown cross-sectional schematic views of typical embodiments of semiconductor devices fabricated according to this invention.

In FIG. 4 are shown curves for determining nitrogen concentration as a function of ammonia flow rate in the process plotted against brightness of light-emitting diodes having a given nitrogen concentration in the region of the P-N junction.

DESCRIPTION OF PREFERRED EMBODIMENTS

Example 1

In preferred embodiments, the process and apparatus used in carrying out the present invention is generally similar to that disclosed in U.S. Pat. No. 3,218,205 to R. A. Ruehrwein, assigned to same assignee herein.

In this example, reference will be made to the preparation of the epitaxially-structured material used to fabricate the device shown sectionally in FIG. 2.

In the epitaxial growth operation shown in FIGS. 1A and 1B, a cleaned and polished substrate wafer of single crystal GaP 1, oriented within 2° of the (100) crystallographic plane, was placed in a fused silica reactor tube located in a furnace. The reactor tube was flushed with hydrogen to remove oxygen from the tube and surface of the substrate. The reactant vapor was produced by introducing a stream of HCl at 3.0 cc/min. into a stream of hydrogen at 50 cc/min. and passing this stream over elemental Ga at 780° C. Simultaneously, a second hydrogen stream at 450 cc/min., into which is introduced 0.75 cc/min. of phosphine ($PH_3$) and about 2.5 cc/min. of a 10 ppm $H_2S$-in-hydrogen mixture, is made up and combined with the HCl-Ga reaction mixture in the reaction zone of the reactor tube heated to 920° C. From the reaction zone the vapors moved to a cooler region of the tube heated to 825° C where epitaxial deposition of GaP was initiated on the surface 2 of the GaP substrate to grow a layer 3 about 250 $\mu$m thick. During the final period of epitaxial growth, 12.5 cc/min. of pure $NH_3$ gas was added to the reactant stream to grow a nitrogen-doped epitaxial layer 4 about 10 $\mu$m thick, doped with nitrogen to a concentration of about $3.0 \times 10^{18} cm^{-3}$, after which growth was terminated and the system cooled to ambient. The structure at this stage is as shown in FIG. 1B.

A sample of the material prepared as above was then diffused for 20 min. at 900° C in an evacuated and sealed ampoule containing 3 mg. of Zn to produce a P-region 4b and P-N junction 5 about 6 $\mu$m deep in the nitrogen doped layer as shown in FIG. 1C. The entire epitaxial layer, including regions 3, 4a and 4b, was doped with sulfur to a net donor concentration of about $7 \times 10^{16} cm^{-3}$.

The material produced in the above process was then fabricated into light-emitting diodes (LED's). The finished wafer was lapped from the substrate side to a thickness of about 5 mils. Because of the thickness of layer 3 this results in the removal of substrate 1 and a portion of layer 3 up to a level represented by dashed line 6 in FIG. 1C to produce the wafer shown in FIG. 1D. For epitaxial structures having a total thickness for layers 3 through 4b (FIG. 1C) of less than about 5 mils, the device would appear as in FIG. 3 in which a portion of the substrate 1 is included in the device. Ohmic contact was made to the N-type surface 6 (FIG. 1D) by vacuum evaporating a layer 7 (FIGS. 2 and 3) of Au/Ce (124) alloy onto the surface and bonding the latter to a suitable header 8, such as a TO-18 header, having negative terminal post 9 (positive terminal not shown). Ohmic contact was then made to the P-surface of the device by attaching thereto a gold wire 10 by ultrasonic bonding.

LED's fabricated with the material produced by the process of this example produced an average brightness at room temperature of about 545 foot-Lamberts at a wavelength of about 5600 A with a current of 20 mA for diodes having an area of about $1 \times 10^{-3} cm^2$.

In a series of runs performed in accordance with conditions of the above process, except for different $NH_3$ flow rates, LED's were fabricated which produced average brightnesses of well over 700 foot-Lamberts. Ammonia flow rates of up to about 50 cc/min. were used to produce GaP material doped with nitrogen to concentrations within the range of from >1.0 × $10^{18}$cm$^{-3}$ to about 3.0 × $10^{19}$cm$^{-3}$. The data resulting from this particular series of runs indicates that nitrogen concentrations in the nitrogen-doped surface region should be on the order of >1.0 × $10^{18}$cm$^{-3}$ to about 2.5–3.0 × $10^{-19}$cm$^{-3}$, with best average results, to date, having nitrogen concentrations within a range of from about 8.0 × $10^{18}$cm$^{-3}$ to about 2.0 × $10^{19}$cm$^{-3}$. LED's having nitrogen concentrations within the latter range produced average brightnesses of about 715 foot-Lamberts, some of which have produced a brightness of 750 foot-Lamberts.

Example 2

This example illustrates the comparative performance of GaP LED's produced without nitrogen doping.

The process described in Example 1 was repeated identically, except that the NH$_3$ flow, and introduction of nitrogen into the epitaxial GaP material was omitted. The GaP produced by this process was then diffused with Zn to form the P-N junction and fabricated into LED's as in the preceding example.

The average room temperature brightness of a batch of diodes fabricated from the nitrogen-free material was only about 240 foot-Lamberts at a peak wavelength of about 5540 A with a current of 20 mA for diodes having an area of about 1 × $10^{-3}$cm$^2$.

Data for the runs described in the above examples for nitrogen-doped and nitrogen-free LED's is set out in graphical form in FIG. 4, which shows curves corresponding LED brightness with nitrogen concentration as a function of ammonia flow rate. To read the composite graph, one selects a given ammonia (NH$_3$) flow rate on the abscissa, reads upwardly on the ordinate (not shown) for that flow rate to intersect points on both curves. At the intersect point on the lower curve (trace for the $x$ data points), one reads to the right to obtain the nitrogen concentration; at the intersect point on the upper curve (trace for the dotted data points), one reads to the left to obtain the brightness of LED's having the specified nitrogen concentration. The nitrogen-free LED's (zero NH$_3$ flow rate) are shown to have a brightness of about 240 foot-Lamberts.

The brightness measurements referred to herein were obtained using epoxy-encapsulated diodes (epoxy lens not shown in the drawings) mounted on TO-18 headers using Am/Ge preforms.

Although the data set forth in FIG. 4 show the significant improvements already achieved by nitrogen-doping according to this invention, the process has not as yet been optimized and further improvement is expected.

Example 3

This example exemplifies an embodiment of the invention wherein epitaxial GaP is grown on a GaAs substrate. A comparison is also presented between nitrogen-doped and nitrogen-free LED's.

The process operation here follows that described above, again having reference to the steps shown in FIGS. 1A–1D, but for a slight modification. In order to minimize crystal strain and imperfections due to lattice mismatch of the GaAs substrate and epitaxial GaP, an initial layer of graded composition gallium arsenide phosphide (not shown in the drawings) is grown as an interface region between the substrate surface 2 and the epitaxial film. The H$_2$/HCl/Ga reaction mixture is produced as above. However, the second gaseous reactant stream is made up by adding 3.6 cc/min. of arsine (AsH$_3$) and about 1.0 cc/min. of a 100 ppm diethyl telluride in H$_2$ mixture to a stream of 450 cc/min. of H$_2$. The reactant streams are then combined at a reaction temperature of about 925° C and contacted with the GaAs substrate oriented within 2° of the (100) plane at a deposition temperature of 840° C to grow the initial graded composition layer. Then by decreasing the AsH$_3$ flow to zero while introducing PH$_3$ and increasing its flow rate from zero to 2.4 cc/min., an epitaxial film 3 of binary GaP is grown to a thickness of about 255 $\mu$m. During the final period of growth, 300 cc/min. of a 10% NH$_3$-in-H$_2$ mixture is substituted for a 300 cc/min. H$_2$ stream to produce a nitrogen-doped surface layer (region 4 in FIG. 1B) about 19 $\mu$m thick.

The GaP material is then fabricated into LED's in the same manner as described in Example 1. These LED's produce an average brightness of about 400 foot-Lamberts at a current of 20 mA for diodes having an area of about 1 × $10^{-3}$cm$^2$. By way of comparison, LED's of the same area fabricated in the same manner, but without nitrogen doping, produce an average brightness of only 110 foot-Lamberts at a current of 20 mA.

The lower brightness values for GaP LED's grown on GaAs substrates, as compared with those grown on GaP substrates (for which data is presented in FIG. 4), is believed to be due to the introduction of non-radiative recombination centers into the epitaxial GaP by dislocations and/or strain originating in the lattice mismatch with substrate. However, the significant improvement accruing from nitrogen-doping vis-a-vis nitrogen-free in LED brightness is apparent.

The absorption of the high energy, short wavelength, portions of the emission band by high nitrogen concentrations produce an additional apparent shift in the peak emission energy, which is minimized by confining the nitrogen doping to the vicinity of the P-N junction.

In preferred embodiments of the invention, referring now to FIGS. 1B and 1C, the region 3 is preferably about 100 $\mu$m thick, but can have thicknesses within the range 5–250 $\mu$m or more. The N-type region 4$a$ of the nitrogen-doped surface layer preferably should be about 5 $\mu$m, but more broadly can have thicknesses within the range 0–200 $\mu$m or more. The P-type region 4$b$ of the nitrogen-doped layer preferably should be about 5–10 $\mu$m thick and, more broadly, can be from 1 to 25 $\mu$m or slightly more. Thus, it will be noted that in some embodiments, the P-N junction may be formed at the interface between the nitrogen-doped and the nitrogen-free regions of the epitaxial GaP materials and LED's of this invention. However, in preferred embodiments as exemplified in the above examples, the epitaxial GaP structures are shown in FIG. 2 (with layer 1 and a portion of layer 3 removed by lapping) and FIG. 3.

In preferred embodiments, the epitaxial GaP film is doped with N-type impurities and diffused with P-type impurities to form the P-N junction. In other embodiments, the bulk of the epitaxial film is doped with P-type impurities and diffused with N-type impurities. The diffusion may suitably be conducted by various means known to the art, including solid, liquid or gas phase diffusions. An alternative method for forming the P-N junction is to substitute an impurity of the opposite conductivity type to that previously used in the reactant vapors and grow a layer of the opposite conductivity type containing the isoelectronic impurity. Suitable impurities include those conventionally used in the art, e.g., S, Se, Te or Si for N-type doping and Be, Zn or Cd for P-type doping. The N-type impurity concentration range is broadly, from about $2.0 \times 10^{16} - 2.0 \times 10^{17} cm^{-3}$ and, preferably, about $7.0 \times 10^{16} cm^{-3}$. The surface concentration of P-type impurities is typically on the order of $10^{19}$ atoms/cm$^3$.

With respect to the nitrogen dopant, as indicated above, in preferred embodiments, the nitrogen is selectively introduced into the growing epitaxial film only in the region in which the P-N junction is to be formed, typically in the upper 5–20 μm surface region (layer 4 in FIG. 1B). The nitrogen concentration in this surface region is typically about $1.0 \times 10^{18} - 3.0 \times 10^{19}$ atoms/cm$^3$. The isoelectronic impurity may be introduced from any suitable source, e.g., pure ammonia, NH$_3$, elemental nitrogen, or other gaseous or volatile compounds thereof.

With further respect to the LED's of this invention, the presence of substrate 1, which is essential in producing the desired material, is not essential to the operation of the final device and it may be removed wholly or partially, as well as a portion of layer 3 (as shown in FIGS. 1C, 1D and FIG. 2), in reducing the thickness of the semiconductor chip to a convenient value of 100 to 150 μm. In the embodiments using GaAs as a substrate it is preferable to remove the substrate 1 to minimize absorption losses and gain radiation reflected from layer 7.

Other modifications within the purview of this invention include the use of other substrates whose lattice structure is compatible with epitaxial growth of the GaP film, e.g., Ge, ZnS, etc. It is also contemplated that other isoelectronic impurities than nitrogen may be used in the manner of this invention for fabrication into electroluminescent devices.

It is also contemplated that vapor epitaxial deposition processes other than those specifically used in the working examples above may be employed for this invention when modified to incorporate an isoelectronic impurity into the reactant vapors and epitaxial film as described herein.

The nitrogen-doped GaP material of the present invention is particularly suitable for use in the fabrication of electroluminescent devices which emit light in the green portion of the electromagnetic spectrum, i.e., light having wavelengths between about 5500 A and 5800 A. In many applications, devices which emit light within the green portion of the spectrum are the particular significance from the standpoint of economy and practical utility. Of special importance is the use of green-emitting LED's and arrays thereof as film annotators. As well known, film, like the human eye, is much more sensitive to green light than to red light. Therefore, the use of green light effects a reduction in material requirements, device size, current requirements and film exposure time. These advantages make it possible to increase the information density per unit area and simplify driving circuitry by driving directly from integrated circuitry without intermediate amplifiers.

As indicated above, the nitrogen-doped GaP materials of this invention are fabricated into discrete LED's and monolithic or hybrid arrays thereof by conventional photolithographic techniques involving masking, diffusion, etching, etc. As further indicated above, in preferred embodiments the grown epitaxial GaP material is doped with N-type impurities and the P-N junction formed in the nitrogen-doped region thereof by diffusion with P-type impurities; such diffusion being performed with solid, liquid or gaseous diffusion sources. In a particularly suitable embodiment for diffusing P-type impurities, e.g., Zn, into the GaP material, a solid-solid diffusion system is used. In such system the diffusant source comprises a sandwich-structure of a heat-treated SiO$_2$ layer deposited on the GaP material and covered with a layer of zinc oxide (ZnO) which is covered with a layer of SiO$_2$. This diffusion system may be used to prepare full chip emitter devices or, by use of photolithographic techniques, planar arrays of LED's. In a particularly suitable embodiment for using the SiO$_2$/ZnO/SiO$_2$ diffusant in planar techniques, a diffusion mask comprising a sandwich structure of SiO$_2$, silicon nitride (Si$_3$N$_4$) and SiO$_2$ layers is first deposited on the GaP material, windows opened through the diffusion mask by photolithographic techniques, followed by the sequential deposition of the SiO$_2$, ZnO and SiO$_2$ layers of the diffusant system. These solid-solid diffusion systems are described in more detail in two patent applications, U.S. Ser. No. 134,240 and 134,251, filed Apr. 15, 1971 by John G. Schmidt and assigned to the assignee herein.

Various other modifications of the invention will occur to those skilled in the art without departing from the spirit and scope thereof.

We claim:

1. A process for the preparation of electroluminescent material for light-emitting diodes said process comprising:
   a. providing in a reaction chamber a substrate of a single-crystal compound formed from Ga and one of the elements selected from the group consisting of As and P;
   b. combining in a vapor phase reactant stream reactant materials including electronic impurity atoms, said materials being adapted for the formation of GaP and epitaxial deposition thereof on said substrate, said reactant materials initially being substantially free of isoelectronic impurity atoms;
   c. introducing said reactant stream into said reaction chamber;
   d. epitaxially depositing on said substrate from said stream said reactant materials to form a first epitaxial layer of a first electrical conductivity type on said substrate, said layer constituting a bulk region substantially free of isoelectronic impurities;
   e. introducing into said stream an isoelectronic impurity in vapor form;
   f. epitaxially depositing on said substrate from said stream said reactant materials and said isoelectronic impurity to form a second epitaxial layer of said first conductivity type on said first epitaxial layer, said second epitaxial layer constituting a surface region containing said isoelectronic impurity atoms at a concentration of about $2.0 \times 10^{19}$ atoms/cm.$^3$; and
   g. introducing electronic impurity atoms of a second electrical conductivity type opposite to that of said first conductivity type into said surface region to form a P-N junction in said surface region.

2. Process according to claim 1 wherein said isoelectronic impurity is nitrogen.

3. Process according to claim 1 wherein the concentration of reactant vapors is adjusted to provide an initial region of graded composition between said substrate and said bulk region when the substrate is GaAs.

4. Process according to claim 1 wherein said P-N junction in step (g) is formed by growing an additional layer containing nitrogen and impurity atoms of opposite conductivity type previously used.

5. Process according to claim 1 wherein said P-N junction in step (g) is formed by diffusing impurity atoms of conductivity type opposite to that in said epitaxial film to form a P-N junction therein.

* * * * *